United States Patent
Suzuki et al.

[11] Patent Number: 5,889,116
[45] Date of Patent: Mar. 30, 1999

[54] PHOTOSENSITIVE COMPOSITION FROM COPOLYMERS OF ETHYLENIC PHOSPHOROUS MONOMER(S) AND ELASTOMER

[75] Inventors: Takao Suzuki; Atsuhiro Kanzaki, both of Kawasaki, Japan

[73] Assignee: Nippon Zeon Co., Ltd., Tokyo, Japan

[21] Appl. No.: 761,092

[22] Filed: Dec. 5, 1996

[30] Foreign Application Priority Data

Dec. 6, 1995 [JP] Japan ................................ 7-344882

[51] Int. Cl.$^6$ ................................ C08L 43/02; C08L 9/00
[52] U.S. Cl. ........................ 525/209; 522/110; 525/201; 525/212
[58] Field of Search ........................... 525/209, 201, 525/212; 522/110

[56] References Cited

U.S. PATENT DOCUMENTS 5,679,485  10/1997  Suzuku et al. ............................. 430/18

FOREIGN PATENT DOCUMENTS 0 699 961   6/1996   European Pat. Off. .

WO 96/10218  4/1996  WIPO .

OTHER PUBLICATIONS

EP 0 699 961 Mar. 6, 1996.

*Primary Examiner*—Christopher Henderson
*Attorney, Agent, or Firm*—Armstrong, Westerman, Hattori, McLeland & Naughton

[57] ABSTRACT

A photosensitive composition is provided, which comprises (A) 20–65 wt. parts of an elastomer, (B) 35–80 wt. parts of a hydrophilic copolymer consisting essentially of, based on the weight of the copolymer, (1) 1–30 wt. % of units of a phosphorus-, boron- or sulfur-containing monoethylenically unsaturated monomer, (2) 0.5–25 wt. % of units of a phosphorus-, boron- or sulfur-containing diethylenically unsaturated monomer, (3) 40–90 wt. % of units of a conjugated diene monomer, and (4) 0–58.5 wt. % of units of other copolymerizable monomer; the total amount of the elastomer (A) and the hydrophilic copolymer (B) being 100 wt. parts, (C) 5–100 wt. parts of a photopolymerizable ethylenically unsaturated monomer, and (D) 0.1–10 wt. parts of a photopolymerization initiator. The photosensitive composition is useful for the preparation of a flexographic printing plate.

9 Claims, No Drawings

PHOTOSENSITIVE COMPOSITION FROM COPOLYMERS OF ETHYLENIC PHOSPHOROUS MONOMER(S) AND ELASTOMER

BACKGROUND OF THE INVENTION

(1) Field of the Invention

This invention relates to a hydrophilic copolymer, a process for producing the copolymer, a photosensitive composition comprising the copolymer, and a photosensitive rubber plate made from the copolymer. More particularly, it relates to a photosensitive composition having an improved processability, a photosensitive rubber plate capable of being washed with water at a high rate at the step of development, a hydrophilic copolymer used for the preparation of the photosensitive composition and the photosensitive rubber plate, and a process for producing the hydrophilic copolymer.

(2) Description of the Related Art

A flexographic printing plate is made by a process wherein an original film is closely adhered on a photosensitive surface of a photosensitive rubber or resin plate, the film-adhered photosensitive surface is irradiated with an actinic radiation so that part of the photosensitive surface is exposed to the actinic radiation, and the unexposed area is removed by washing to form a relief. It is generally required that a photosensitive material used for the preparation of the photosensitive rubber plate for a flexographic printing plate can be washed at a high rate so that the relief is easily formed.

As a typical example of the photosensitive material, there can be mentioned a photosensitive elastomer composition comprising an elastomer such as a styrene-butadiene block copolymer or a styrene-isoprene block copolymer and a carboxyl group-containing hydrophilic copolymer as the major ingredients, and a photopolymerizable ethylenically unsaturated monomer. This photosensitive elastomer composition has a problem such that the resulting photosensitive rubber plate cannot be washed at a high rate.

To cope with the above-mentioned problem, i.e., provide a photosensitive elastomer composition capable of being washed at a high rate, it has been proposed in WO 94/-23342 to incorporate in a photosensitive elastomer composition a phosphate ester group-containing copolymer as a hydrophilic copolymer comprising phosphate ester-containing monoethylenically unsaturated monomer units as the indispensable ingredient. This photosensitive elastomer composition has good and balanced transparency and strength, as well as enhanced washability at a high rate.

SUMMARY OF THE INVENTION

A primary object of the present invention is to provide a photosensitive composition having an improved processability.

Another object of the present invention is to provide a photosensitive rubber plate capable of being washed with water at a high rate at the step of development.

Further objects of the present invention are to provide a hydrophilic copolymer used for the preparation of the photosensitive composition and the photosensitive rubber plate, and further to provide a process for producing the hydrophilic copolymer.

In one aspect of the present invention, there is provided a hydrophilic copolymer consisting essentially of, based on the weight of the copolymer:

(1) 1 to 30% by weight of units of a phosphorus-, boron- or sulfur-containing monoethylenically unsaturated monomer, (2) 0.5 to 25% by weight of units of a phosphorus-, boron- or sulfur-containing diethylenically unsaturated monomer, (3) 40 to 90% by weight of units of a conjugated diene monomer, and (4) 0 to 58.5% by weight of units of other copolymerizable monomer.

In another aspect of the present invention, there is provided a process for preparing the above-mentioned hydrophilic copolymer, which comprises the steps of:

allowing a phosphorus-, boron- or sulfur-containing oxo-acid or a salt thereof to react with a hydroxyl group-containing ethylenically unsaturated monomer or a corresponding alkoxide to give a mixture comprising esters of the phosphorus-, boron- or sulfur-containing oxo-acid, and copolymerizing, based on the total weight of the monomers, (1) 5 to 30.5% by weight of the ester mixture, (2) 40 to 90% by weight of a conjugated diene monomer, and (3) 0 to 58.5% by weight of other copolymerizable monomer.

In still another aspect of the present invention, there is provided a photosensitive composition comprising:

(A) 20 to 65 parts by weight of an elastomer, (B) 35 to 80 parts by weight of the above-mentioned hydrophilic copolymer, the total amount of the elastomer (A) and the hydrophilic copolymer (B) being 100 parts by weight, (C) 5 to 100 parts by weight of a photopolymerizable ethylenically unsaturated monomer, and (D) 0.1 to 10 parts by weight of a photopolymerization initiator.

In a further aspect of the present invention, there is provided a photosensitive rubber plate having a laminated structure comprising a substrate and a layer of the above-mentioned photosensitive composition, formed on a major surface of the substrate.

DESCRIPTION OF THE PREFERRED EMBODIMENTS

The hydrophilic copolymer used for the preparation of the photosensitive composition of the present invention is made by radical copolymerization of (1) a phosphorus-, boron- or sulfur-containing monoethylenically unsaturated monomer, (2) a phosphorus-, boron- or sulfur-containing diethylenically unsaturated monomer, (3) a conjugated diene monomer, and optional other copolymerizable monomer.

The phosphorus-containing monoethylenically unsaturated monomer includes phosphate ester group-containing monoethylenically unsaturated monomers and phosphono group ($O{=}P(OH)_2{-}$)-containing monoethylenically unsaturated monomers.

Typical examples of the phosphate ester group-containing monoethylenically unsaturated monomers are phosphate ester group-containing monoacrylates and monomethacrylates, which are represented by the following formula (1):

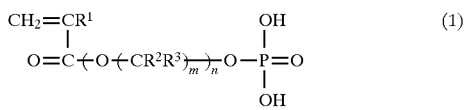

(1)

wherein $R^1$ is hydrogen or a methyl group, $R^2$ and $R^3$ independently represent hydrogen or an alkyl group having 1 to 8 carbon atoms, and m and n independently represent an integer of 1 to 20. As specific examples of the phosphate ester group-containing monoacrylates and monomethacrylates of formula (1), there can be mentioned 2-acryloxyethyl phosphate, 3-acryloxypropyl phosphate, 2-acryloxypropyl phosphate, 4-acryloxybutyl acrylate, diethylene glycol acrylate phosphate, triethylene glycol acrylate phosphate, polyethylene glycol acrylate phosphate, and corresponding methacrylates.

As specific examples of the phosphono group-containing monoethylenically unsaturated monomers, there can be mentioned vinylphosphonic acid, diethylvinylphosphonic acid, phenylvinylphosphonic acid, dimethylvinylphosphonic acid, di-n-butylvinylphosphonic acid, di-isobutylvinylphosphonic acid and di-isopropylvinylphosphonic acid.

The boron-containing monoethylenically unsaturated monomers include, for example, bornyl group-containing methacrylates such as bornyl methacrylate and 2-bornylethyl methacrylate.

The sulfur-containing monoethylenically unsaturated monomers include, for example, sulfonic acids and sulfonates, such as vinylsulfonic acid, 2-sulfoethyl methacrylate, sodium styrenesulfonate, 2-sulfoxyethyl methacrylate, vinyl butylsulfonate, sulfones such as vinylsulfone, sulfoxides such as vinylsulfoxide, and sulfides such as 1-(2-hydroxyethylthio)butadiene.

Among the phosphorus-, boron- or sulfur-containing monoethylenically unsaturated monomers, 2-acryloxyethyl phosphate, 2-acryloxypropyl phosphate, and corresponding methacrylates are preferable.

The phosphorus-, boron- or sulfur-containing monoethylenically unsaturated monomer may be used either alone or in combination.

The amount of the phosphorus-, boron- or sulfur-containing monoethylenically unsaturated monomer is 1 to 30% by weight, preferably 2 to 20% by weight, based on the weight of the total weight of the monomers used for copolymerization.

The phosphorus-containing diethylenically unsaturated monomer includes phosphate ester group-containing diethylenically unsaturated monomers. Typical examples of the phosphate ester group-containing diethylenically unsaturated monomers are phosphate ester group-containing diacrylates and dimethacrylates, which are represented by the following formula (2):

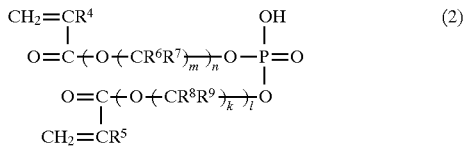

(2)

wherein $R^4$ and $R^5$ independently represent hydrogen or a methyl group, $R^6$, $R^7$, $R^8$ and $R^9$ independently represent hydrogen or an alkyl group having 1 to 8 carbon atoms, and k, l, m and n independently represent an integer of 1 to 20. As specific examples of the phosphate ester group-containing diacrylates and dimethacrylates of formula (2), there can be mentioned bis(2-acryloxyethyl) phosphate, bis(3-acryloxypropyl) phosphate, bis(4-acryloxybutyl) phosphate, bis(diethylene glycol acrylate) phosphate, bis(triethylene glycol acrylate) phosphate and bis(polyethylene glycol acrylate) phosphate. Of these, bis(2-acryloxyethyl) phosphate and bis(3-acryloxypropyl) phosphate, and corresponding methacrylates are preferable.

The phosphorus-containing diethylenically unsaturated monomer may be used either alone or in combination. The amount of the phosphorus-containing diethylenically unsaturated monomer is 0,5 to 25% by weight, preferably 1 to 20% by weight, based on the weight of the total weight of the monomers used for copolymerization.

The ratio of the phosphorus-, boron- or sulfur-containing monoethylenically unsaturated monomer to the phosphorus-, boron- or sulfur-containing diethylenically unsaturated monomer is usually in the range of 90/10 to 20/80, preferably 85/15 to 30/70.

The sum of the phosphorus-, boron- or sulfur-containing monoethylenically unsaturated monomer, and the phosphorus-, boron- or sulfur-containing diethylenically unsaturated monomer is usually in the range of 5 to 30.5% by weight, preferably 5 to 22% by weight based on the total weight of the monomers used for copolymerization. If the sum of the monoethylenically unsaturated monomer and the diethylenically unsaturated monomer is too small, the washing rate of a photosensitive rubber plate made from the photosensitive composition tends to be lowered. In contrast, if the sum of the monoethylenically unsaturated monomer and the diethylenically unsaturated monomer is too large, the photosensitive composition has a reduced processability and the photosensitive rubber plate has a reduced resistance to an aqueous ink.

The phosphorus-, boron- or sulfur-containing monoethylenically unsaturated monomer and the phosphorus-, boron- or sulfur-containing diethylenically unsaturated monomer can also be used as a mixture thereof for copolymerization. Namely, a mixture of phosphorus-, boron- or sulfur-containing monoethylenically unsaturated monomer and the phosphorus-, boron- or sulfur-containing diethylenically unsaturated monomer can be prepared by a process wherein a phosphorus-, boron- or sulfur-containing oxo-acid or a salt thereof is allowed to react with a hydroxyl group-containing ethylenically unsaturated monomer or a corresponding alkoxide to thereby esterify the phosphorus-, boron- or sulfur-containing oxo-acid or the salt, and the thus-prepared mixture can be used for copolymerization as it is.

As specific examples of the phosphorus-, boron- or sulfur-containing oxo-acid or the salt thereof, there can be mentioned phosphoric acid, phosphonic acid, boric acid, sulfuric acid, peroxosulfuric acid, disulfuric acid, peroxodisulfuric acid, and sodium and potassium salts thereof. Of these, phosphoric acid is most preferable.

As specific examples of the hydroxyl group-containing ethylenically unsaturated monomer or the corresponding alkoxide, there can be mentioned hydroxyalkyl methacrylates and acrylates, which have 1 to 10 carbon atoms in the hydroxyalkyl group, such as hydroxyethyl methacrylate, hydroxymethyl methacrylate, hydroxymethyl acrylate and hydroxyethyl acrylate.

The esterification reaction of the phosphorus-, boron- or sulfur-containing oxo-acid or the salt thereof with the hydroxyl group-containing ethylenically unsaturated monomer or the corresponding alkoxide can be conducted in a conventional manner. Conventional catalysts, solvents and others can be used.

The ratio of the phosphorus-, boron- or sulfur-containing monoethylenically unsaturated monomer to the phosphorus-, boron- or sulfur-containing diethylenically unsaturated monomer in the esterification product can be controlled by a process wherein the ratio of the phosphorus-, boron- or sulfur-containing oxo-acid or the salt thereof to the hydroxyl group-containing ethylenically unsaturated monomer or the corresponding alkoxide is varied, or, a process wherein, after completion of the esterification reaction, the reaction product is hydrolyzed by adding water or other hydrolyzing agent.

The amount of the esterification product, i.e., the mixture of the phosphorus-, boron- or sulfur-containing monoethylenically unsaturated monomer to the phosphorus-, boron- or sulfur-containing diethylenically unsaturated monomer for copolymerization is 5 to 30.5% by weight, preferably 5 to 22% by weight based on the total weight of the monomers for copolymerization.

As specific examples of the conjugated diene monomer, there can be mentioned 1,3-butadiene, isoprene, chloroprene, 1,3-pentadiene, 2,3-dimethyl-1,3-butadiene and 1,3-hexadiene. Of these, 1,3-butadiene and isoprene are preferable, These conjugated dienes may be used either alone or in combination. The amount of the conjugated diene for copolymerization is usually in the range of 40 to 90% by weight, preferably 50 to 80% by weight based on the total weight of the monomers. If the amount of the conjugated diene monomer is too small, the photosensitive rubber plate has a poor strength. In contrast, if the amount of the conjugated diene is too large, the washing rate of the photosensitive rubber plate is reduced.

As specific examples of the other copolymerizable monomer optionally used for copolymerization, there can be used ethylenically unsaturated monocarboxylic acids such as acrylic acid and methacrylic acid; ethylenically unsaturated polycarboxylic acids such as maleic acid, fumaric acid, citraconic acid and itaconic acid; esters of ethylenically unsaturated monocarboxylic acids such as methyl acrylate, ethyl acrylate, propyl acrylate, n-amyl acrylate, isoamyl acrylate, hexyl acrylate, ethylhexyl acrylate, octyl acrylate, methyl methacrylate, ethyl methacrylate, propyl methacrylate, n-amyl methacrylate, isoamyl methacrylate, hexyl methacrylate, ethylhexyl methacrylate, octyl methacrylate, glycidyl acrylate, glycidyl methacrylate, hydroxyethyl acrylate, hydroxypropyl acrylate, hydroxylethyl methacrylate and hydroxypropyl methacrylate; partially esterified products of ethylenically unsaturated polycarboxylic acids such as monoethyl maleate and monomethyl itaconate; vinyl cyanide monomers such as methacrylonitrile and acrylonitrile; aromatic vinyl monomers such as styrene, o-methylstyrene, m-methylstyrene, p-methylstyrene, p-tert.-butylstyrene, 1,3-dimethylstyrene, chlorostyrene, vinylnaphthalene and vinylanthracene; and ethylenically unsaturated glycidyl ethers such as allyl glycidyl ether.

These optional copolymerizable monomers may be used either alone or in combination. The amount of the copolymerizable monomer is up to 58.5% by weight based on the total weight of the monomers for copolymerization.

A minor amount of a polyfunctional ethylenically unsaturated monomer is preferably used to enhance the processability of the photosensitive composition and transparency and strength of the photosensitive rubber plate. As specific examples of the polyfunctional ethylenically unsaturated monomer, there can be mentioned acrylic acid esters of polyhydric alcohols such as ethylene glycol diacrylate, trimethylolpropane triacrylate and propylene glycol diacrylate, and corresponding methacrylic acid esters; and polyfunctional aromatic vinyl monomers such as divinylbenzene and trivinylbenzene. Of these polyfunctional ethylenically unsaturated monomers, ethylene glycol dimethacrylate and divinylbenzene are preferable. The amount of the polyfunctional ethylenically unsaturated monomer is usually up to 10% by weight based on the total weight of the monomers for copolymerization.

The above-mentioned monomers are copolymerized by a radical polymerization procedure, especially by an emulsion polymerization procedure. A radical initiator and an emulsifier used are not particularly limited and may be conventional.

The hydrophilic copolymer has a structure expressed by the following formula (3):

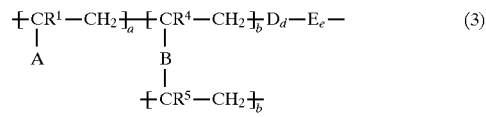

wherein $R^1$, $R^4$ and $R^5$ independently represent hydrogen or a methyl group, A and B independently represent a functional group comprising a phosphorus, boron or sulfur atom, D is a conjugated diene unit, E is other monomer unit, and a, b, d and e are mole numbers of the respective recurring units and satisfy the following ratios, which are % by weight.

$a/(a+b+d+e)$=1 to 30, preferably 2 to 20, $b/(a+b+d+e)$=0.5 to 25, preferably 1 to 20, $d/(a+b+d+e)$=40 to 90, preferably 50 to 80, $e/(a+b+d+e)$=0 to 58.5.

"A" preferably represents a group of the following formula (4):

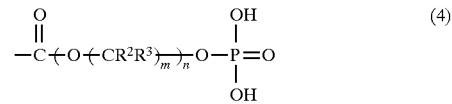

wherein $R^2$ and $R^3$ independently represent hydrogen or an alkyl group having 1 to 8 carbon atoms, and m and n independently represent an integer of 1 to 20.

"B" preferably represents a group of the following formula (5):

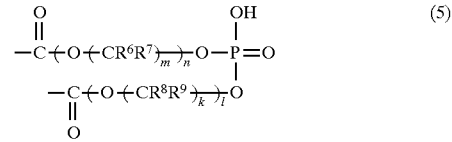

wherein $R^6$, $R^7$, $R^8$ and $R^9$ independently represent hydrogen or an alkyl group having 1 to 8 carbon atoms, and k, l, m and n independently represent an integer of 1 to 20.

To enhance the processability of the photosensitive composition and strength of the photosensitive rubber plate, the hydrophilic copolymer usually has a gel content of 50 to 100%, preferably 60 to 100% and more preferably 70 to 100%. By the term "gel content" used herein is meant a value expressed by the formula:

Gel content (%)=$(B/A) \times 100$ wherein A and B are weight of the copolymer as measured before and after immersion in tetrahydrofuran, respectively. The immersion in tetrahydrofuran is carried out by placing a hydrophilic copolymer in a particle or flock form in a basket of metal mesh, and immersing the copolymer in tetrahydrofuran at 20° C. for 24 hours, followed by drying.

As examples of the elastomer incorporated in the photosensitive composition of the present invention, there can be mentioned block copolymers such as a block copolymer comprising polystyrene blocks A and polybutadiene blocks B, and a block copolymer comprising polystyrene blocks A and polyisoprene blocks B; random copolymers such as an SB random copolymer comprising as the essential ingredients styrene and butadiene, an NB random copolymer comprising as the essential ingredients acrylonitrile-and butadiene, a styrene-isoprene copolymer, and a methyl methacrylatebutadiene copolymer; and polybutadiene, polyisoprene and natural rubber.

Among the above-recited elastomers, block copolymers are preferable. Especially preferable block copolymers comprise blocks A of a polymer predominantly comprised of aromatic vinyl monomer units and blocks B of a conjugated diene polymer comprising as the essential ingredient conjugated diene units having a vinyl bond content of 10 to 70%, preferably 20 to 55%.

The weight average molecular weight of blocks A of the especially preferable copolymer is usually in the range of 3,000 to 200,000, preferably 8,000 to 100,000. The weight average molecular weight of blocks B of the copolymer is usually in the range of 5,000 to 500,000, preferably 10,000 to 300,000. The weight average molecular weight of the whole copolymer is usually in the range of 8,000 to 2,000,000, preferably 18,000 to 1,000,000.

The weight average molecular weight is measured by gel permeation chromatography using an instrument having columns packed with polystyrene wherein the measurement system is calibrated with polystyrene.

The conjugated diene units in the conjugated diene polymer of blocks B has a vinyl bond content of 10 to 70%, preferably 20 to 55%. If the vinyl bond content is smaller than 10%, the photosensitive rubber plate has a reduced transparency, and the strength balance is deteriorated and the washing rate is reduced. If the vinyl bond content is larger than 70%, the strength of the photosensitive rubber plate is reduced.

The content of vinyl bond means the ratio of the sum of conjugated diene units having a 1,2-bond and conjugated diene units having a 3,4-bond to the total of conjugated diene units having 1,2-bond, 3,4-bond and 1,4-bond. The content of vinyl bond is measured by a nuclear magnetic resonance spectroscopic analysis.

The ratio of blocks A to blocks B is usually in the range of 5/95 to 95/5 by weight, preferably 10/90 to 90/10 by weight and more preferably 15/85 to 75/25 by weight.

The structure of combined blocks A and blocks B in the block copolymers preferably used in the present invention is not particularly limited, and, as examples of the structure of combined blocks A and blocks B, there can be mentioned those which are represented by the formulae: $(A—B)_n—A$, $(A—B)_n—A—B$, $B—(A—B)_n—A—B$, $(A—B)_n—X$, $((A—B)_n—A)_m—X$, $(B—A—(B—A)_n)_m—X$ and $(B—A—(B—A)_n—B)_m—X$. Of these, structures of the type $A—B—A$ are preferable. In these formulae, "A" is polymer block A, preferably polystyrene block A, "B" is polymer block B, preferably polybutadiene or polyisoprene block B, "X" is a residue of a coupling agent or a poly-functional initiator for ionic polymerization, "n" and "m" independently represent an integer of at least 1, preferably 1 to 5. As specific examples of the coupling agent, there can be mentioned tin tetrachloride, silicon tetrachloride, epoxidized esters, polyvinyl compounds, carboxylic acid esters and poly-halogenated hydrocarbons. As specific examples of the polyfunctional initiator, there can be mentioned polyfunctional organolithium compounds.

The block copolymer which is used as the elastomer ingredient for the photosensitive composition of the present invention is prepared by copolymerization of the above-mentioned monomers using an organolithium compound or other polymerization initiators. More specifically, a monomer charge predominantly comprised of an aromatic vinyl monomers is polymerized to give polymer blocks A, and successively a monomer charge comprising a conjugated diene as the essential ingredient is added to the polymerization mixture containing the polymer blocks A to give polymer blocks B each connected to the molecular terminal of polymer block A, and finally, either a monomer charge predominantly comprised of an aromatic vinyl monomer is further added to the polymerization mixture comprising the polymer blocks A—B to form polymer blocks A each connected to each polymer block B of the polymer blocks A—B, or a coupling agent is added to the polymerization mixture comprising the polymer blocks A—B.

The procedure by which the content of vinyl bond in the polymer blocks B is controlled is not particularly limited, but the content of vinyl bond is usually controlled by varying the kind and amount of the polar compound used for the preparation of the polymer blocks B and the polymerization temperature.

The amount of the elastomer contained in the photosensitive composition is in the range of 20 to 65 parts by weight, preferably 30 to 60 parts by weight, based on 100 parts by weight of the sum of the elastomer and the hydrophilic copolymer. If the amount of the elastomer is too large, the photosensitive rubber plate made from the photosensitive composition exhibits a reduced rate of washing. In contrast, if the amount of the elastomer is too small, the processability of the photosensitive composition and the resistance of the photosensitive rubber plate to an aqueous ink are reduced.

The photopolymerizable ethylenically unsaturated monomer incorporated in the photosensitive composition of the present invention is liquid or solid at normal temperatures. As specific examples of the photopolymerizable ethylenically unsaturated monomer, there can be mentioned aromatic vinyl monomers such as styrene, o-methylstyrene, m-methylstyrene, p-methylstyrene, p-tert.-butylstyrene, 1,3-dimethylstyrene, chlorostyrene, vinylnaphthalene, vinylanthracene, divinylbenzene and trivinylbenzene; ethylenically unsaturated nitrile monomers such as acrylonitrile and methacrylonitrile; ethylenically unsaturated carboxylic acid ester monomers such as methyl acrylate, ethyl acrylate, propyl acrylate, n-amyl acrylate, isoamyl acrylate, hexyl acrylate, ethylhexyl acrylate, octyl acrylate, glycidyl acrylate, methyl methacrylate, ethyl methacrylate, propyl methacrylate, n-amyl methacrylate, isoamyl methacrylate, hexyl methacrylate, ethylhexyl methacrylate, octyl methacrylate, glycidyl acrylate, hydroxyethyl acrylate, hydroxypropyl acrylate, hydroxyethyl methacrylate, hydroxypropyl methacrylate, ethylene glycol diacrylate, trimethylolpropane triacrylate, 1,4-butanediol diacrylate, 1,4-butanediol dimethacrylate, propylene glycol diacrylate, 1,6-hexanediol diacrylate, 1,6-hexanediol dimethacrylate, 1,9-nonanediol diacrylate, 1,9-nonanediol dimethacrylate, methoxyethylene glycol acrylate, methoxypropylene glycol methacrylate, methoxyethylene glycol methacrylate, methoxypropylene glycol acrylate, dimethyl maleate and dimethyl itaconate; ethylenically unsaturated glycidyl ethers such as allyl glycidyl ether; ethylenically unsaturated monocarboxylic acids such as acrylic acid and methacrylic acid; ethylenically unsaturated polycarboxylic acids such as maleic acid, fumaric acid, citraconic acid and itaconic acid; partial esters of ethylenically unsaturated polycarboxylic acids such as monoethyl maleate and monomethyl itaconate; and phosphate ester group-containing ethylenically unsaturated monomers such as 2-acryloxyethyl phosphate, 3-acryloxypropyl phosphate, 2-acryloxypropyl phosphate, 4-acryloxybutyl acrylate, bis(2-acryloxyethyl) phosphate, bis(3-acryloxypropyl) phosphate, bis(4-acryloxybutyl) phosphate, diethylene glycol acrylate phosphate, triethylene glycol acrylate phosphate, polyethylene glycol acrylate phosphate, bis(diethylene glycol acrylate) phosphate, bis(triethylene glycol acrylate) phosphate and bis(polyethylene glycol acrylate) phosphate, and corresponding phosphate ester group-containing methacrylates.

The amount of the photopolymerizable ethylenically unsaturated monomer is in the range of 5 to 100 parts by weight, preferably 7 to 80 parts by weight, based on 100 parts by weight of the sum of the elastomer and the hydrophilic copolymer. If the amount of the photopolymerizable ethylenically unsaturated monomer is too small, the photosensitive composition is cured only to an insufficient extent when exposed to actinic radiation, and thus, the photosensitive rubber plate has a reduced strength. In contrast, if the amount of the photopolymerizable ethylenically unsaturated monomer is too large, the photosensitive rubber plate has reduced strength and resistance to solvents.

As specific examples of the photopolymerization initiator incorporated in the photosensitive composition of the present invention, there can be mentioned α-diketones such as diacetyl and benzil; acyloins such as benzoin and pivaloin; acyloin ethers such as benzoin ethyl ether and benzoin isopropyl ether; and polynuclear quinones such as anthraquinone and 1,4-naphthoquinone.

The amount of the photopolymerization initiator is in the range of 0.1 to 10 parts by weight, preferably 0.5 to 8 parts by weight, based on 100 parts by weight of the sum of the elastomer and the hydrophilic copolymer. If the amount of the photopolymerization initiator is too small, the photosensitive composition is cured only to an insufficient extent when exposed to actinic radiation, and thus, the photosensitive rubber plate has a reduced strength. In contrast, if the amount of the photopolymerization initiator is too large, the rate of photopolymerization is reduced.

The photosensitive composition of the present invention may have incorporated therein additives such as a plasticizer, a stabilizer and an anti-ozonant, if desired.

As specific examples of the plasticizer, there can be mentioned hydrocarbon oils such as naphthenic oil and paraffinic oil, polystyrene having a molecular weight of not higher than 3,000, petroleum resin, a polyacrylate, liquid 1,2-polybutadiene, liquid 1,4-polybutadiene, terminal modified products of these polybutadienes, and a liquid acrylonitrile-butadiene copolymer, a liquid styrenebutadiene copolymer and carboxylated products thereof.

As specific examples of the stabilizer, there can be mentioned phenolic stabilizers such as hydroquinone, pyrogallol, p-methoxyphenol, tert.-butyl catechol and 2,6-di-tert.-butyl-p-cresol, quinone stabilizers such as benzoquinone, p-toluquinone and p-xyloquinone, and amine stabilizers such as phenyl-α-naphthylamine.

The photosensitive composition of the present invention is prepared by mixing and kneading the above-mentioned ingredients by using, for example, a kneader or a roll mill. The order in which the ingredients are mixed and kneaded is not particularly limited, but preferably, the hydrophilic copolymer and the elastomer are mixed and kneaded together, and thereafter, the photopolymerizable ethylenically unsaturated monomer and the photopolymerization initiator are incorporated therein, and the mixture is kneaded together. The hydrophilic copolymer used in the present invention exhibits good wrapping capability around rolls and does not exhibit undesirable stickiness, and thus, it has good processability on rolls.

The photosensitive rubber plate of the present invention has a laminated structure comprising a substrate and a layer of the above-mentioned photosensitive composition, formed on a major surface of the substrate.

The substrate is made of a flexible sheet or film. If desired, a release layer is formed on the side of the substrate confronting the photosensitive composition layer, and, if desired, an undercoat composed of an adhesive or a primer is formed between the release layer and the photosensitive composition layer. The substrate is not particularly limited provided that it is capable of being used in conventional flexographic printing plates. As examples of the substrate, there can be mentioned flexible film such as polyethylene terephthalate film, polypropylene film or polyimide film; and flexible sheet made of polyethylene terephthalate, polypropylene or polyimide, which has a backing made of an elastic or soft material such as natural rubber, synthetic rubber or a plasticized vinyl chloride resin.

The formation of the photosensitive composition on a major surface of the substrate can be conducted by a conventional -procedure. For example, (i) the photosensitive composition is shaped into a sheet form by using an extruder, a press or a calender, and, simultaneously with or after formation of the sheet, the sheet is contact-bonded or adhered to the substrate, or (ii) the ingredients of the photosensitive composition are dissolved in a solvent such as chloroform, carbon tetrachloride, trichloroethane, methyl ethyl ketone, diethyl ketone, benzene, toluene or tetrahydrofuran, and the solution is cast in a sheet forming mold and the solvent is evaporated to form a sheet, and, simultaneously with or after formation of the sheet, the sheet is contact-bonded or adhered to the substrate.

The photosensitive rubber plate of the present invention may have a thin layer composed of a non-sticking water-soluble polymer composition, which is formed on the outer exposed surface of the layer of the photosensitive composition.

In many cases, the surface of the photosensitive composition layer is sticky and therefore, when an original film is applied thereon, bubbles are formed between the photosensitive composition layer and the original film. This leads to, when exposed to light, irregular deflection of light hindering the light exposure an curing of the photosensitive composition layer. Consequently, the reproducibility of a relief is deteriorated and the original film applied on the photosensitive layer becomes difficult to reuse. This problem can be overcome by forming a thin layer of a non-sticking water-soluble layer on the photosensitive composition layer.

The photosensitive rubber plate of the present invention may have an outer covering film which is formed on the thin non-sticking water-soluble polymer layer and has a function of protecting the photosensitive composition. The outer covering film is made of a flexible film and, in some case, it may have a releasing function. As examples of the covering film, there can be mentioned a polyethylene terephthalate film, a polyethylene film, a polypropylene film and a polystyrene film.

The thickness of the outer covering film is usually in the range of 75 to 200 μm, preferably 100 to 150 μm. With a thickness smaller than 75 μm, the film has a poor strength and the photosensitive rubber plate tends to be distorted. In contrast, with a thickness larger than 200 μm, the film has too high strength and the film becomes difficult to separate from the photosensitive composition.

The photosensitive rubber plate of the present invention may have a foam backing adhered on the surface of the substrate opposite to the photosensitive composition layer. The foam backing has a function of adjusting the printing pressure applied on flexographic printing.

The invention will now be described specifically by the following examples that by no means limit the scope of the invention. In the examples parts and % are by weight unless otherwise specified.

Properties of photosensitive compositions and photosensitive rubber plates were determined by the following methods.

(1) Rate of washing

A photosensitive rubber plate was cut into six square specimens each having a size of 30 mm×30 mm. A polyethylene terephthalate film was peeled from one side of each specimen, and the exposed photosensitive composition was developed with a developing solution (an aqueous 2% solution of coconut oil fatty acid diethanolamide) at 50° C. for 3, 6, 9, 12, 15 and 18 minutes by using a developing apparatus for flexographic printing plate (JOW-A2-SS type, supplied by Nippon Denshi Seiki K.K.). The developed specimen was rinsed with water and then dried at 70° C. for 20 minutes. The thickness of the square specimens was measured before development and after development for respective times and drying. The rate of washing was expressed by the change in thickness per unit time (mm/min).

(2) Processability

A photosensitive composition is milled by a 6 inch roll at a temperature of 80° to 120° C. and the state of being wrapped around the roll was observed. The processability was evaluated by the following three ratings.

A: the composition was well wrapped around the roll and the dimensional stability was good.

B: the composition was well wrapped around the roll, but the dimensional stability was somewhat unsatisfactory.

C: the composition was not wrapped around the roll, or could not processed because it exhibited large stickiness.

EXAMPLE 1

An autoclave was charged with 200 parts of water and then 60 parts of butadiene, 18 parts of ethyl acrylate, 7.6 parts of 2-methacryloxyethyl phosphate, 3.9 parts of bis(2-methacryloxyethyl) phosphate, 10 parts of styrene, 0.5 part of ethylene glycol dimethacrylate, 4 parts of sodium dodecylbenzenesulfonate, 0.3 part of potassium persulfate and 0.4 part of tert.-dodecyl mercaptan were added in the autoclave. The mixture was heated to 50° C. to initiate an emulsion polymerization, and, when the conversion reached 95%, a terminator was added to complete polymerization. The polymerization mixture was cooled with water to give an aqueous emulsion of copolymer. Lauryl-diethanolamine was added into the emulsion to coagulate the polymer, and the thus-obtained crumb was separated and vacuum-dried at 60° C. to give a hydrophilic copolymer having a gel content of 92%.

By using a kneader, 55 parts of the hydrophilic copolymer, 45 parts of a block copolymer (polystyrene-polybutadiene-polystyrene block copolymer, styrene/butadiene=20/80 by weight, vinyl bond content 32%, weight average molecular weight 150,000), 50 parts of liquid polybutadiene ("Nisso" PB, B1000, supplied by Nippon Soda Co.) and 0.2 part of. 2,6-di-tert.-butyl-p-cresol were kneaded together at 150° C. to obtain a uniform mixture, and then, the temperature was lowered to 120° C. at which 15 parts of 1,9-nonanediol dimethacrylate, 1 part of benzoin methyl ether and 0.02 part of methyl hydroquinone, followed by kneading to give a photosensitive composition.

The photosensitive composition was filled in a frame mold, the upper and lower sides of which are opened with a spacer thickness of 3 mm. Two polyethylene terephthalate films each having a thickness of 0.1 mm were applied onto the upper and lower sides of the mold so that the photosensitive composition was sandwiched between the films. The sandwiched photosensitive composition was press-formed into a sheet at a temperature of 110° to 130° C. and a pressure of 150 kgf by using a press, and then cooled to give a photosensitive rubber plate having a total thickness of 3.0 mm. The properties of the photosensitive rubber plate were evaluated. The results are shown in Table 1.

EXAMPLES 2 TO 4, COMPARATIVE EXAMPLES 1 AND 2

Hydrophilic copolymers, photosensitive compositions and photosensitive rubber plates were made by the same procedures as described in Example 1 except that the monomer composition for copolymerization was varied as shown in Table 1. Evaluation results of the photosensitive rubber plates are shown in Table 1.

As seen from Table 1, when the amount of a phosphate ester group-containing monoethylenically unsaturated monomer or a phosphate ester group-containing diethylenically unsaturated monomer is too small, a photosensitive composition made from the resulting hydrophilic copolymer cannot be well wrapped around a roll. When appropriate and balanced amounts of a phosphate ester group-containing monoethylenically unsaturated monomer and a phosphate ester group-containing diethylenically unsaturated monomer are used in combination, a photosensitive composition made from the resulting hydrophilic copolymer is well wrapped around a roll and the photosensitive rubber plate exhibits a high rate of washing for development.

TABLE 1

|  | Example | | | | Comp. Example | |
| --- | --- | --- | --- | --- | --- | --- |
|  | 1 | 2 | 3 | 4 | 1 | 2 |
| Composition of hydrophilic copolymer (parts) | | | | | | |
| 1,3-Butadiene | 60 | 60 | 60 | 60 | 60 | 60 |
| Ethyl acrylate | 18 | 18 | 18 | 18 | 18 | 18 |
| Styrene | 10 | 10 | 10 | 10 | 10 | 10 |
| 2-Methacryloxyethyl phosphate | 7.6 | 5.8 | 9.7 | 3.6 | 11.2 | 0.5 |
| Bis(2-methacryloxyethyl) phosphate | 3.9 | 5.7 | 1.8 | 7.9 | 0.3 | 11.0 |
| Ethylene glycol dimethacrylate | 0.5 | 0.5 | 0.5 | 0.5 | 0.5 | 0.5 |
| Hydrophilic copolymer | | | | | | |
| Gel content (%) | 92 | 94 | 91 | 95 | 85 | 97 |
| Properties of photosensitive rubber plate | | | | | | |
| Rate of development (mm/min) | 0.17 | 0.18 | 0.14 | 0.20 | 0.07 | 0.20 |
| Processability | A | A | A | B | C | C |

EXAMPLE 5

In ethanol, 98 parts of phosphoric acid and 680 parts of 2-hydroxyethyl methacrylate were dissolved, and the solution was maintained at 70° C. in a nitrogen gas atmosphere for 5 hours to conduct a reaction. The water was added and the reaction was continued further for 5 hours to give a mixture of 2-methacryloxyethyl phosphate and bis(2-methacryloxyethyl) phosphate. The ratio of 2-methacryloxyethyl phosphate to bis(2-methacryloxyethyl) phosphate was 66/34 by weight.

An autoclave was charged with 200 parts of water, and then, the above-mentioned mixture of 2-methacryloxyethyl phosphate and bis(2-methacryloxyethyl) phosphate (the total amount of 2-methacryloxyethyl phosphate and bis(2-methacryloxyethyl) phosphate in the mixture was 11.5 parts), 60 parts of butadiene, 18 parts of ethyl acrylate, 10 parts of styrene, 0.5 part of ethylene glycol dimethacrylate, 4 parts of sodium dodecylbenzenesulfonate and 0.4 part of tert.-dodecyl mercaptan were incorporated in the autoclave. The mixture was maintained at 50° C. to conduct an emulsion polymerization, and, when the conversion reached 96%, a terminator was added to terminate the polymerization. The polymerization mixture was cooled with water to give a polymer emulsion. Lauryldiethanolamine was incorporated to coagulate the polymer. The thus-obtained crumb was separated and vacuum-dried at 60° C. to give a hydrophilic copolymer having a gel content of 94%.

By the same procedures as described in Example 1, a photosensitive composition and a photosensitive rubber plate were made from the hydrophilic copolymer. The photosensitive rubber plate exhibited a development rate of 0.18 mm/min and a processability of rating A.

What is claimed is:

1. A photosensitive composition comprising:
   (A) 20 to 65 parts by weight of an elastomer,
   (B) 35 to 80 parts by weight of a hydrophilic copolymer,
   (C) 5 to 100 parts by weight of a photopolymerizable ethylenically unsaturated monomer, and
   (D) 0.1 to 10 parts by weight of a photo-polymerization initiator;
   said hydrophilic copolymer (B) consisting essentially of, based on the weight of the copolymer:
   (1) 1 to 30% by weight of units of a phosphorus-containing monoethylenically unsaturated monomer,
   (2) 0.5 to 25% by weight of units of a phosphorus-containing diethylenically unsaturated monomer,
   (3) 40 to 90% by weight of units of a conjugated diene monomer, and
   (4) 0 to 58.5% by weight of units of at least one copolymerizable monomer selected from the group consisting of ethylenically unsaturated monocarboxylic acids and esters thereof, ethylenically unsaturated polycarboxylic acids and partially esterified products thereof, vinyl cyanide monomers, aromatic vinyl monomers, and ethylenically unsaturated glycidyl ethers;
   wherein the ratio of the phosphorus-containing monoethylenically unsaturated monomer (1) to the phosporus-containing diethylenically unsaturated monomer (2) in said hydrophilic copolymer (B) being in the range of 90/10 to 20/80 by weight;
   and said hydrophilic copolymer (B) having a gel content of 50 to 100%, as expressed by the following formula:

gel content (%)=(b/a)×100 wherein a and b are dry weight of the copolymer as measured before and after immersion in tetrahydrofuran at 20° C. for 24 hours, respectively; the total amount of the elastomer (A) and the hydrophilic copolymer (B) being 100 parts by weight.

2. A photosensitive composition according to claim 1, wherein the phosphorus-containing monoethylenically unsaturated monomer is a phosphate ester group-containing monoethylenically unsaturated monomer, and the phosphorus-containing diethylenically unsaturated monomer is a phosphate ester group-containing diethylenically unsaturated monomer.

3. A photosensitive composition according to claim 2, wherein the phosphate ester group-containing monoethylenically unsaturated monomer is a phosphate ester group-containing monoacrylate or monomethacrylate, which is represented by the following formula (1):

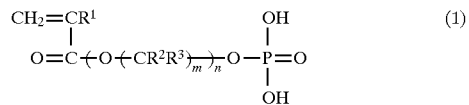

wherein $R^1$ is hydrogen or a methyl group, $R^2$ and $R^3$ independently represent hydrogen or an alkyl group having 1 to 8 carbon atoms, and m and n independently represent an integer of 1 to 20; and the phosphate ester group-containing diethylenically unsaturated monomer is a phosphate ester group-containing diacrylate or dimethacrylate, which is represented by the following formula (2):

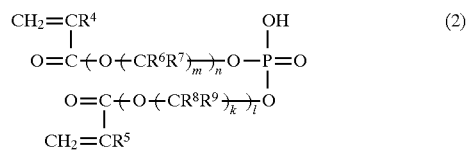

wherein $R^4$ and $R^5$ independently represent hydrogen or a methyl group, $R^6$, $R^7$, $R^8$ and $R^9$ independently represent hydrogen or an alkyl group having 1 to 8 carbon atoms, and k, l, m and n independently represent an integer of 1 to 20.

4. A photosensitive composition according to claim 3, wherein the phosphate ester group-containing monoacrylate or monomethacrylate is selected from the group consisting of 2-acryloxyethyl phosphate and 2-acryloxypropyl phosphate, and corresponding methacrylates, and the phosphate ester group-containing diacrylate or dimethacrylate is selected from the group consisting of bis(2-acryloxyethyl) phosphate and bis(3-acryloxypropyl) phosphate, and corresponding methacrylates.

5. A photosensitive composition according to claim 1, wherein the sum of the phosphorus-containing monoethylenically unsaturated monomer and the phosphorus-containing diethylenically unsaturated monomer is in the range of 5 to 30.5% by weight based on the total weight of the monomers used for copolymerization.

6. A photosensitive composition according to claim 1, wherein the elastomer is a block copolymer.

7. A photosensitive composition according to claim 6, wherein the block copolymer comprises blocks A of a polymer predominantly comprised of aromatic vinyl monomer units and blocks B of a conjugated diene polymer comprising as the essential ingredient conjugated diene units having a vinyl bond content of 10 to 70%.

8. A photosensitive composition according to claim 6, wherein the block copolymer has a structure of a type A—B—A wherein "A" is a polystyrene block, and "B" is a polybutadiene or polyisoprene block.

9. A photosensitive composition according to claim 6, wherein the block copolymer has a weight average molecular weight of 8,000 to 2,000,000.

* * * * *